(12) United States Patent
Wu et al.

(10) Patent No.: US 8,551,847 B2
(45) Date of Patent: Oct. 8, 2013

(54) METHOD FOR FORMING METAL GATE

(75) Inventors: Chun-Yuan Wu, Yunlin County (TW);
Chin-Cheng Chien, Tainan (TW);
Chiu-Hsien Yeh, Tainan (TW);
Yeng-Peng Wang, Kaohsiung (TW)

(73) Assignee: United Microelectronics Corp.,
Science-Based Industrial Park, Hsin-Chu
(TW)

( * ) Notice: Subject to any disclaimer, the term of this
patent is extended or adjusted under 35
U.S.C. 154(b) by 189 days.

(21) Appl. No.: 13/070,496

(22) Filed: Mar. 24, 2011

(65) Prior Publication Data
US 2012/0244675 A1    Sep. 27, 2012

(51) Int. Cl.
*H01L 21/336* (2006.01)
(52) U.S. Cl.
USPC ........... 438/301; 438/216; 438/231; 438/199;
438/183; 257/401; 257/213; 257/288; 257/E21.409
(58) Field of Classification Search
USPC .......... 438/301, 216, 231, 199, 183; 257/401,
257/213, 288, E21.409
See application file for complete search history.

(56) References Cited

U.S. PATENT DOCUMENTS

| | | | | |
|---|---|---|---|---|
| 6,087,231 A | * | 7/2000 | Xiang et al. | 438/287 |
| 6,303,418 B1 | * | 10/2001 | Cha et al. | 438/199 |
| 6,410,376 B1 | * | 6/2002 | Ng et al. | 438/199 |
| 6,468,851 B1 | * | 10/2002 | Ang et al. | 438/216 |
| 7,217,611 B2 | | 5/2007 | Kavalieros | |
| 7,556,998 B2 | | 7/2009 | Park | |

* cited by examiner

*Primary Examiner* — Thinh T Nguyen
(74) *Attorney, Agent, or Firm* — Winston Hsu; Scott Margo

(57) ABSTRACT

A method for forming a metal gate is provided. First, a dummy material is formed to completely cover a substrate. Second, a dopant is selectively implanted into the dummy material. Then, some of the dummy material is removed to expose part of the substrate and to form a dummy gate including a dopant region disposed between a first region and a second region. Later an interlayer dielectric layer is formed to surround the dummy gate. Next, a selective etching step is carried out to remove the first region to form a recess without substantially removing the dopant region. Afterwards, the recess is filled with a material set to form a metal gate.

21 Claims, 11 Drawing Sheets

METHOD FOR FORMING METAL GATE

BACKGROUND OF THE INVENTION

1. Field of the Invention

The present invention generally relates to a method for forming a metal gate. In particular, the present invention is directed to a method for forming a metal gate which is constructed from a recess substantially free of undercut. The recess which is substantially free of undercut is made by selective etching to remove an undoped dummy material without substantially damaging a doped dummy material, which avoids the problem of lateral erosion of the recess by the etching.

2. Description of the Prior Art

In the manufacturing procedures of semiconductor elements, some etching processes are usually used to define the locations of needed elements. For example, during the manufacturing procedures of static random access memory (SRAM), a pair of adjacent gate structures is needed to be formed. Generally speaking, in order to metal gates two consecutive etching processes are usually needed to respectively define the locations of the first metal gate structure and the second metal gate structure.

In the first etching process, generally a wet etching process, a mask is usually used to protect some regions from unwanted etching in order to restrict the extent of the etching by an etchant. As a matter of fact, the etchant will always inevitably carry out a collateral lateral etching in addition to the predetermined vertical etching, in particular to remove the target material at the edge of the mask, in spite of the protection of the mask. As a result, such collateral lateral erosion will always lead to a void undercut under the edge of the mask. Such void undercut on one hand twists the shape of the needed recess, and on the other hand it also jeopardizes the performance of the adjacent semiconductor element.

Accordingly, a solution is still needed to remove the target material without substantially harming the adjacent material so as to form a perfect recess with no undercut present.

SUMMARY OF THE INVENTION

In view of this, the present invention consequently proposes a solution to remove the target material without substantially harming the adjacent material so the present invention is useful in forming a perfect recess with no undercut present, in particular in forming a perfect recess for a metal gate.

The present therefore proposes a method for forming a metal gate. First, a substrate is provided. Second, a dummy material is formed to completely cover the substrate. Next, a dopant is selectively implanted into the dummy material to form a dopant region. Then, some of the dummy material is removed to expose part of the substrate and to form a dummy gate. The dummy gate includes the dopant region disposed between a first region and a second region. Later an interlayer dielectric layer is formed to surround the dummy gate. Next, a selective etching step is carried out to remove the first region to form a first recess without substantially removing the dopant region and the second region so that the first recess does not substantially extend into the dopant region. Afterwards, the first recess is filled with a first material set to form a first metal gate.

In one embodiment of the present invention, the dopant is selected forma group consisting of a Group (III) element and carbon. In another one embodiment of the present invention, a mask is used to cover the second region of the dummy material to facilitate the selective etching. In still another one embodiment of the present invention, the dopant region and the second region in the dummy gate are further removed to form a second recess after the completion of the first metal gate, and moreover the second recess is filled with a second material set to form a second metal gate which is adjacent to the first metal gate. In yet another one embodiment of the present invention, the dopant region and the second region in the dummy gate may be removed sequentially or simultaneously. In another one embodiment of the present invention, the first metal gate is one of a PMOS and an NMOS and the second metal gate is the other. In a further one embodiment of the present invention, both the first metal gate and the second metal gate are disposed in an SRAM.

The method of the present invention uses a selective etching step to remove an undoped dummy material without substantially damaging a nearby doped dummy material to form a recess which is substantially free of an undercut. Such recess which is substantially free of an undercut is suitable to construct a good metal gate. The method of the present invention avoids the problem of collateral lateral erosion of the recess during the etching so an undercut is caused below the edge of the mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
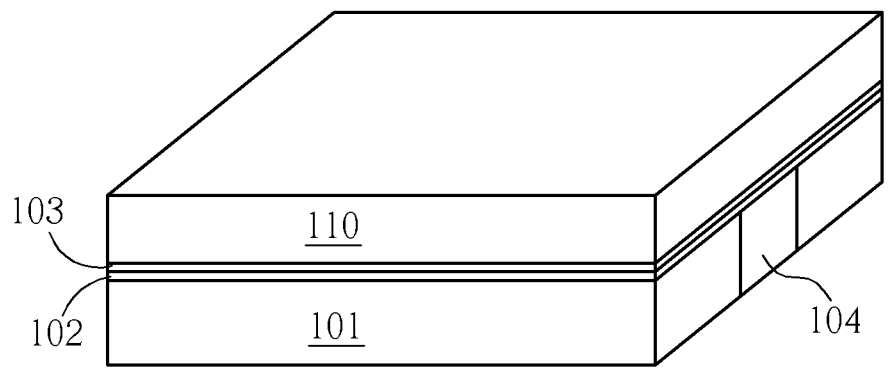
FIGS. 1-10 illustrate some exemplary steps for forming a metal gate of the present invention.

Please refer to FIGS. 1-10, illustrating some exemplary steps for forming a metal gate of the present invention. First, please refer to FIG. 1, a substrate 101 is provided. The substrate 101 is usually a semiconductive material, such as a Si wafer or a silicon-on-insulator (SOI). Second, a dielectric material layer and a dummy material 110 are sequentially formed to completely cover the substrate 101. The dielectric material layer may be a regular dielectric material layer 102 and/or a high-k dielectric material layer 103, and the dummy material 110 is used to temporarily fill in for a metal gate (not shown), so it may be considered as a sacrificial material. For example, the dummy material 110 maybe an undoped Si. A conventional deposition method may be used to form a blanket deposition of the dummy material 110 with a suitable thickness. In addition, there may be some dope wells (not shown) or shallow trench isolation 104 in the substrate 101 and the details will not be elaborated here. There may be an optional barrier/etching-stop layer disposed between the dummy material 110 and the high-k dielectric material layer 103. This optional layer may be made of TiN, SiN . . . etc. This optional layer may increase the compatibility between the dummy material 110 and the high-k dielectric material layer 103, and/or serve as the etching-stop layer when the dummy material 110 is removed in a later step.

Figure 2:
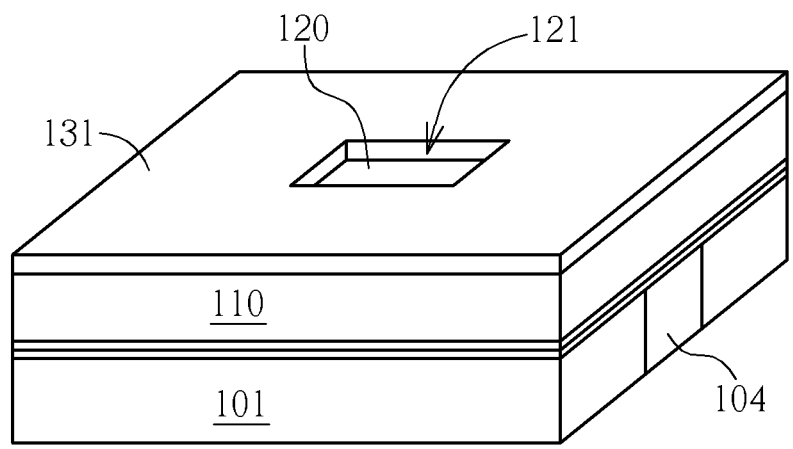

Next, please refer to FIG. 2, a suitable dopant 121, such as B, Al of a Group (III) element or carbon, is selectively implanted into the dummy material 110 to form a dopant region 120. The locations of the dopant region 120 is preferably pre-determined, so they are located at the border regions between the adjacent metal gates (not shown) of different types, such as an NMOS and a PMOS. For example, a mask 131 such as a photoresist may be used to protect other regions to introduce the needed dopant into the exposed regions. Later, the mask 131 is removed.

Figure 3:
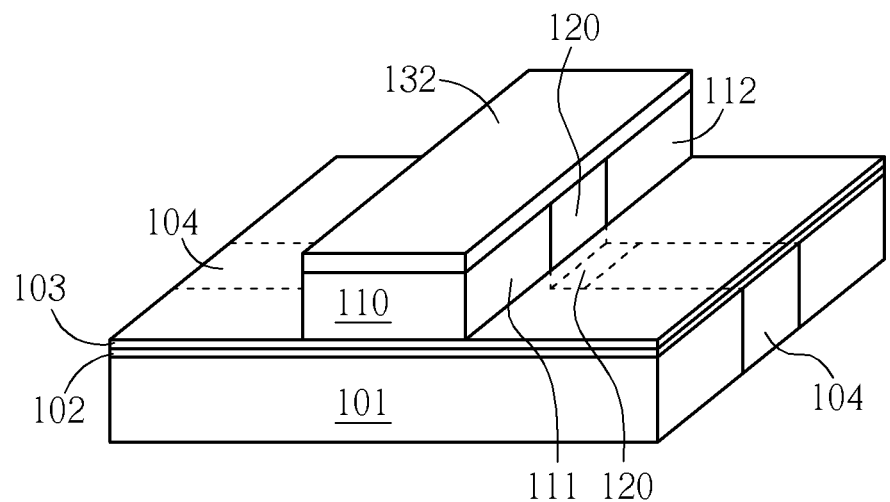

Then, as shown in FIG. 3, some of the dummy material 110 and the dielectric material layer are removed to expose part of the substrate 101 so that the dummy material 110 at the moment becomes an island-like dummy gate 110. The dummy gate 110 includes a first region 111, a second region 112 and a dopant region 120 disposed between the first region 111 and the second region 112. The first region 111 and the second region 112 are used to form the needed PMOS and NMOS. The shallow trench isolation 104 is part of the isolation structure of the first region 111 and the second region 112. The dopant region 120 may be disposed on an insulating isolation structure, such as on the shallow trench isolation 104. For example, another mask 132 is used to protect the dummy gate 110 and to etch the excessive dummy material 110 by an etching step. After the etching step is completed, the mask 132 may stay in reserve for the moment. The mask 132 may include a metal material or a dielectric material, for example, titanium nitride, silicon nitride or silicon carbide.

Figure 4:
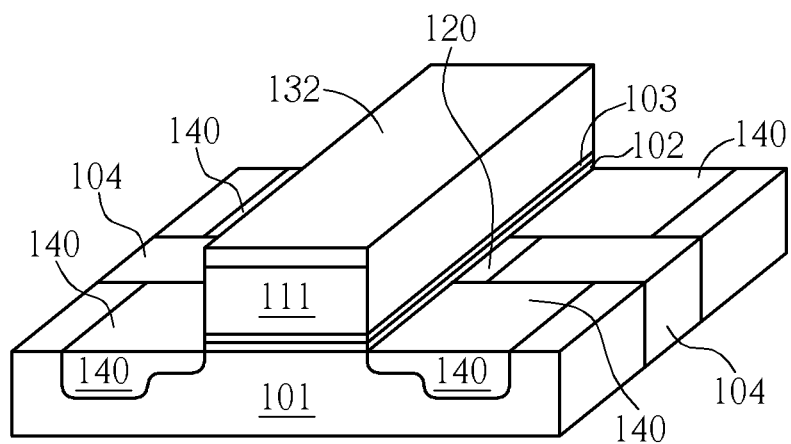

Later, please refer to FIG. 4, an optional step for a source/drain doping is carried out after the completion of the dummy material 110, so the needed source/drain 140 is formed in the exposed substrate 101 adjacent to the dummy gate 110. Preferably, some sources/drains 140 of different conductivity types are respectively formed in the exposed substrate 101 adjacent to the first region 111 and the second region 112 of the dummy gate 110. At this moment, the mask 132 protects the dummy gate 110 from being doped when the source/drain doping step is carried out. Besides, depending on the process demands and on product requirements, there may be other structures such as spacers, lightly doped regions, self-aligned salicide, and/or recessed epitaxial layers present and the details will not be elaborated here.

Figure 5:
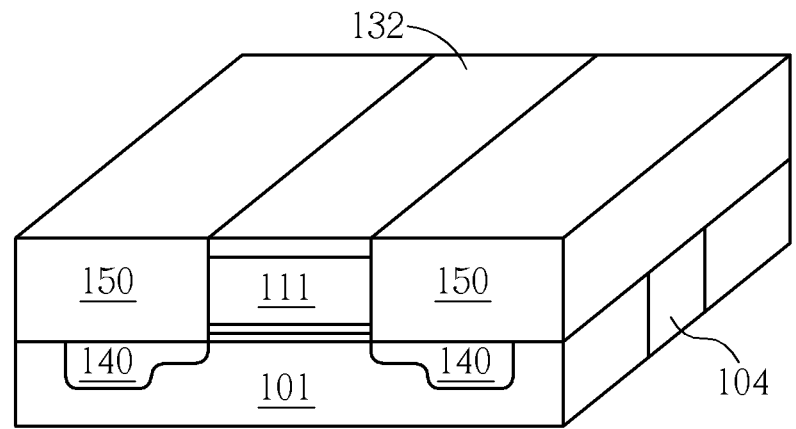

Please refer to FIG. 5, an interlayer dielectric layer 150 is preliminarily formed to cover the exposed substrate 101, and simultaneously surrounds the dummy gate 110. However, the interlayer dielectric layer 150 does not cover the dummy gate 110 at all. For example, the interlayer dielectric layer 150 is first formed to completely cover the exposed substrate 101, the mask 132 and the dummy gate 110. Then, a planarization step is carried out to remove some of the interlayer dielectric layer 150 and to expose the mask 132. Hence, the interlayer dielectric layer 150 and the mask 132 may approximately have the same height. Or alternatively, the mask 132 is also removed when some of the interlayer dielectric layer 150 is removed so that the interlayer dielectric layer 150 and dummy gate 110 may approximately have the same height, as shown in FIG. 6.

Figure 6:
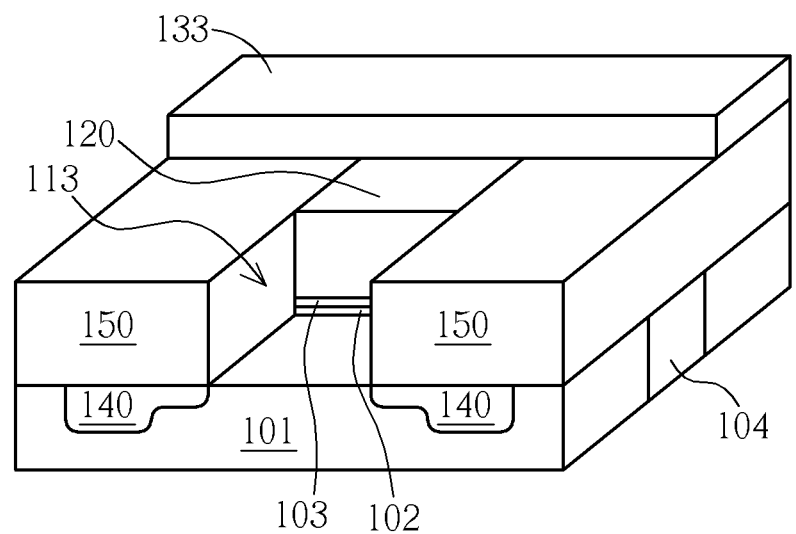

Next, please continue to refer to FIG. 6, a selective etching step is carried out to remove the first region 111 in the dummy gate 110 to form a first recess 113. For example, an etching mask 133 is employed to completely cover the second region 112, or to additionally cover some or all of the dopant region 120, but the first region 111 is anyway completely exposed. The selective etching step has a relatively larger etching rate with respect to the undoped region, i.e. the first region 111 so all of the second region 112 which is protected by the etching mask 133 and the dopant region 120 which is subject to a lower etching rate remain substantially intact. As a result, the first recess 133 does not and cannot extend into the adjacent dopant region 120. Given the above, there is no possible collateral lateral etching and there is no drawback of the undercut formed below the etching mask 133 since there is no undercut present. The term "the dopant region 120 which is subject to a lower etching rate remains substantially intact" means the etching selectivity between the first region 111 and the dopant region 120 is at least greater than 50 under such selective etching step. Such etching selectivity is subject to different etchants, temperatures . . . etc.

In one embodiment of the present invention, a wet etching, such as using a basic etchant, is employed to execute the selective removal of the first region 111 in the dummy gate 110. A suitable etchant may be a diluted HF (DHF) along with aqueous ammonia or tetramethylammonium hydroxide (TMAH). For example, the diluted HF (DHF) is first used to carry out a pre-etching at room temperature. Next, the basic etchant completely removes the dummy gate 110 to form a first recess 113. Or alternatively, a dry etching may go with a wet etching. For example, a wet etching is used after a dry etching to execute the selective removal of the first region 111 in the dummy gate 110.

Figure 7:
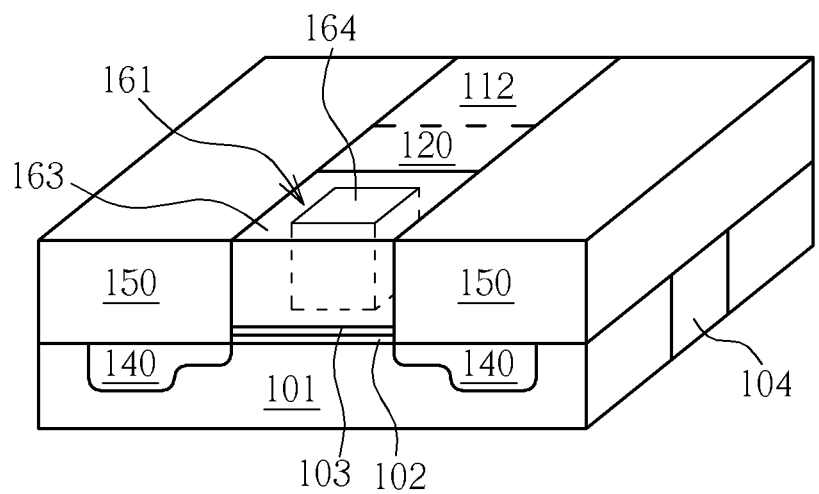

Afterwards, please refer to FIG. 7, the first recess 113 is filled with a first material set 161 to form a first metal gate 160. If there is excessive first material set 161 which covers the interlayer dielectric layer 150, a planarization procedure may be used to remove the excessive first material set 161 to expose the interlayer dielectric layer 150. The first material set 161 may include a work function metal layer 163 and a low resistance metal 164. The work function metal layer 163 may be a single metal material or a composite metal material. By means of a proper combination of the work function metal layer 163 in the first material set 161, the first metal gate 160 may be correctly adjusted to have a suitable work function. The suitable high-k dielectric layer 162 and the work function metal layer 163 are known to persons in the art.

Figure 7A:
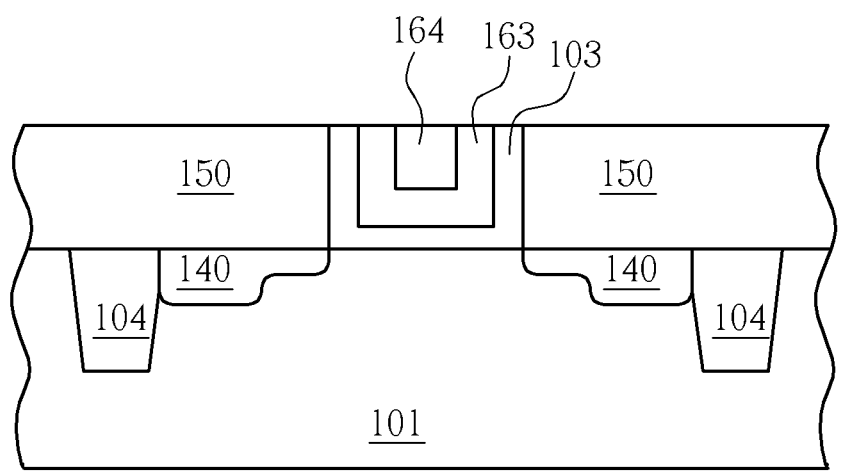

In another embodiment as shown in FIG. 7A, a cross section view is illustrated. After the first region 111 in the dummy gate 110 is removed and before the first recess 113 is filled with a first material set 161, a high-k dielectric material layer 103 in a U-shape may be formed in advance, then the work function metal layer 163 and the low resistance metal 164 are formed. In such a way, the high-k dielectric material layer is not needed to be formed under the dummy material 110.

Figure 8:
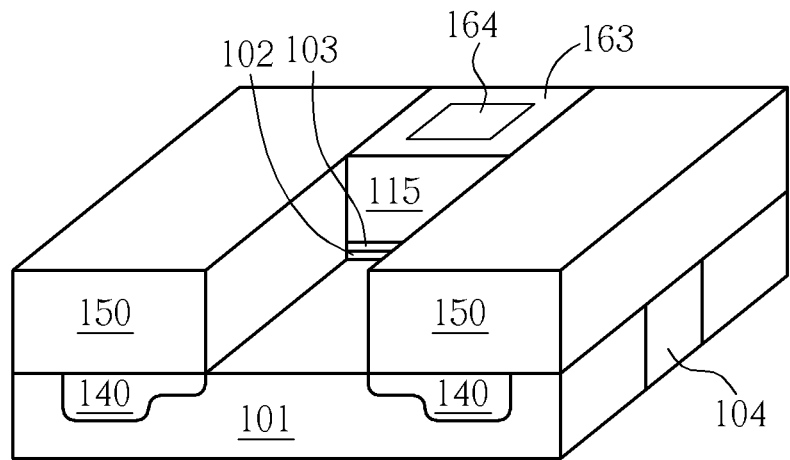

Then please refer to FIG. 8 illustrating a side view of another direction, another etching step is carried out to remove the dopant region 120 and the second region 112 in the dummy gate 110 to form a second recess 115. A dry etching may go with a wet etching, or a wet etching alone such as a basic etchant, may be used to execute the removal of the dopant region 120 and the second region 112 in the dummy gate 110 without the help of a mask. A suitable etchant may be tetramethylammonium hydroxide (TMAH) of higher temperature and higher concentration (compared with the selective removal of the first region 111), or other tetraalkylammonium hydroxide.

Figure 9:
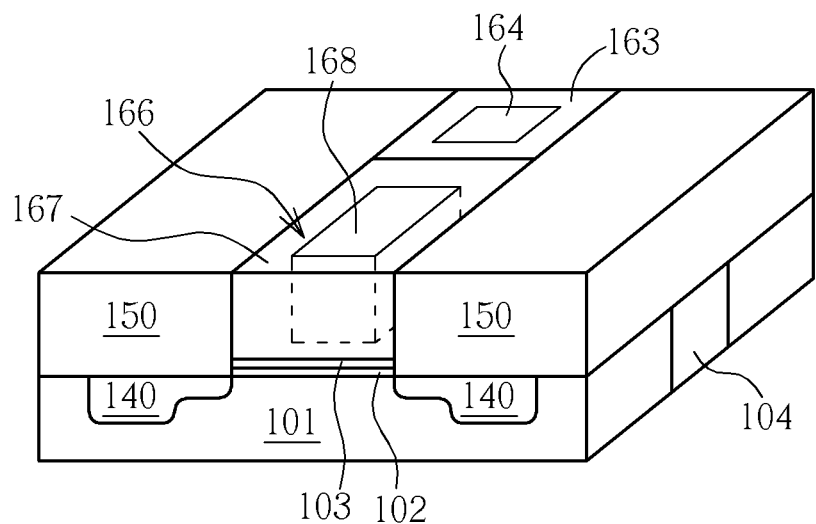
Figure 10:
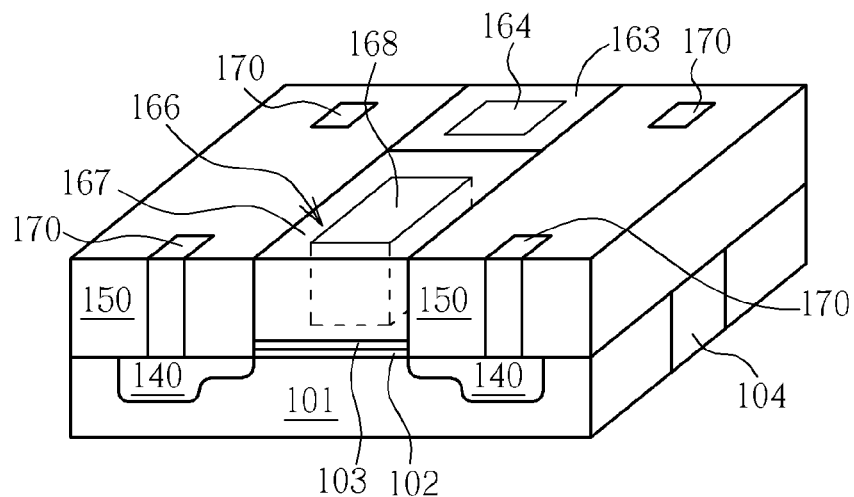

Later, please refer to FIG. 9, the second recess 115 is filled with a second material set 166 to form a second metal gate 165. If there is excessive second material set 166 which covers the interlayer dielectric layer 150, a planarization procedure may be used to remove the excessive second material set 166 to expose the interlayer dielectric layer 150. The second material set 166 may include a work function metal layer 167 and a low resistance metal 168. The work function metal layer 167 may be a single metal material or a composite metal material. By means of a proper combination of the work function metal layer 163 in the second material set 166, the second material set 166 may be correctly adjusted to have a suitable work function.

If the first metal gate 160 is one of a PMOS and an NMOS, the second metal gate 165 is the other one. Correspondingly, the sources and drains 140 adjacent to the first metal gate 160 or the second metal gate 165 have the corresponding P or N conductivity. The first metal gate 160 and the second metal gate 165 are gates next to each other in an SRAM, and the first metal gate 160 and the second metal gate 165 are in direct contact with and directly electrically connected to each other by the work function metal layers. The suitable high-k dielectric layer 103 and the work function metal layer 163/167 are known to persons in the art. For example, the high-k dielectric layer 103 maybe $HfSiO_x$, $HfSiO_xN_y$, $HfO_x$, $LaO_x$, $LaAlO_x$, $ZrO_x$, $ZrSiO_x$, $HfZrO_x$ or the combination thereof. The N-type work function metal material may be TiN, TaC, TaN, $TaSiN_y$, and/or Al. The P-type work function metal material may be TiN, W, WN, Pt, Ni, Ru, TaCN or TaCNO.

When both the first metal gate 160 and the second metal gate 165 are completed, the formation of the contact plugs 170 for use in electrically connecting the source/drain 140 of the first metal gate 160 and the second metal gate 165 follows. For example, please refer to FIG. 10, the interlayer dielectric layer 150 is first formed to completely cover the first metal gate 160 and the second metal gate 165, then contact holes (not shown), which expose the source/drain 140, are formed. Later, a suitable conductive material fills up the contact holes (not shown) to construct the contact plugs 170. Optionally, there may be some salicide (not shown) disposed between the contact plugs 170 and the source/drain 140.

Figure 11:
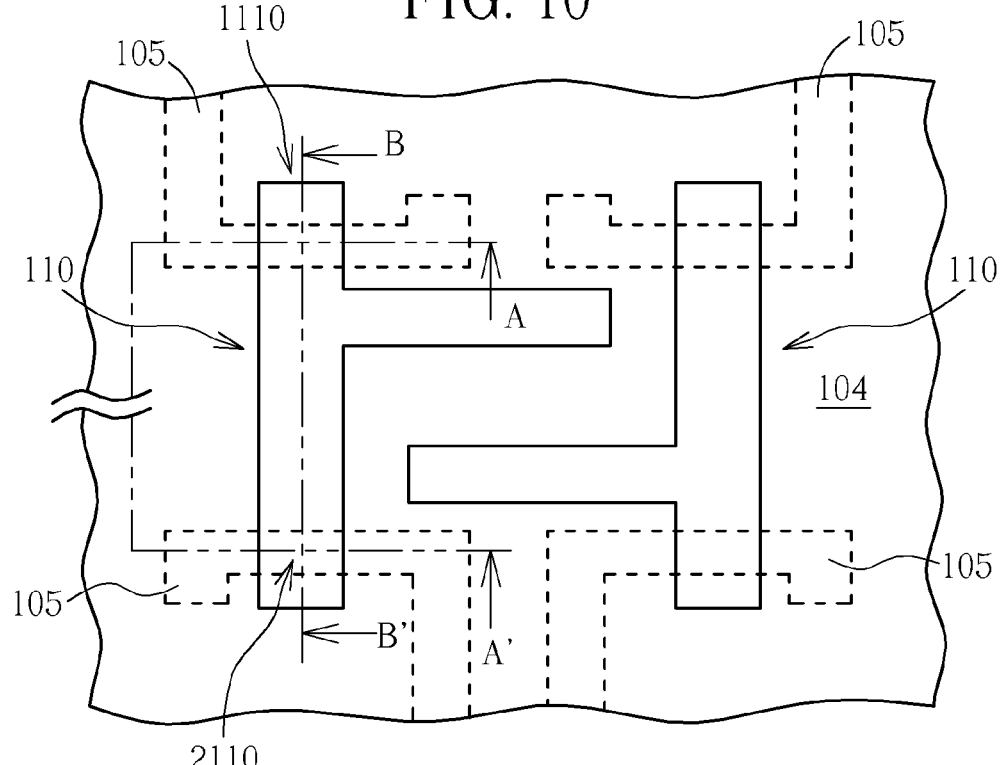
FIGS. 11-17 illustrate some exemplary steps for forming adjacent metal gates of the present invention.
Figure 12:
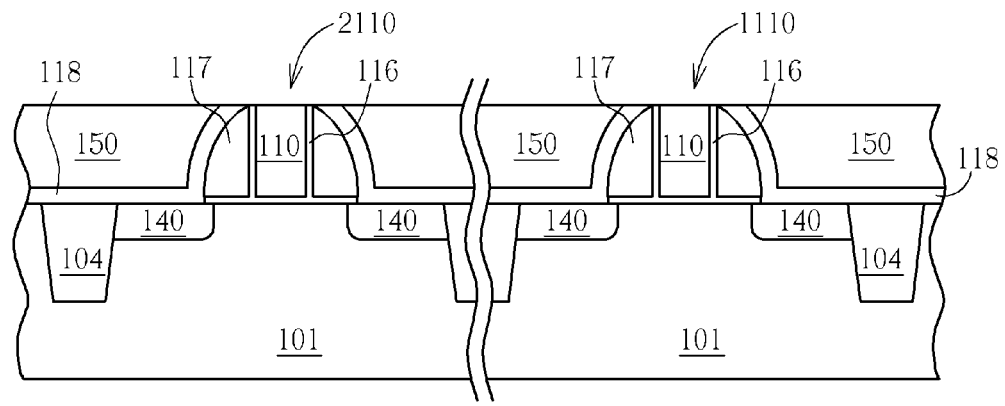

Please refer to FIGS. 11-17, illustrating some exemplary steps for forming adjacent metal gates of the present invention. This example points out that a hard mask is patterned by a photoresist and a low resistance metal is used to replace the dummy material to forma first metal gate and the second metal gate. First, please refer to both FIG. 11 and FIG. 12. FIG. 12 is a side view taken from the cross section A-A' of FIG. 11. A substrate 101 is provided. The substrate 101 is usually a semiconductive material, such as a Si wafer or a silicon-on-insulator (SOI). The substrate 101 is covered by an interlayer dielectric layer 150. In addition, the substrate 101 may include a source/drain 140 and a shallow trench isolation 104. There are dummy materials 110 which are adjacent to each other on the substrate 101. There are active regions 105 formed on the substrate 101. The locations on which the dummy materials 110 and the active regions 105 meet each other are for the MOS devices in the future.

The dummy gates 1110 includes a dummy material 110, a seal layer 116 including SiN, a spacer 117, an etching-stop layer 118 and an optional normal dielectric layer 102 or a high-k dielectric layer 103. The dummy gates 2110 also includes a dummy material, a seal layer including, a spacer, an etching-stop layer and an optional normal dielectric layer but they are optionally omitted for illustration purpose. The spacer 117 may have a single structure or a multi-structure.

The substrate 101 has already undergone a chemical mechanical polishing step (CMP), so that the top surface of the dummy gates 1110/2110 and of the interlayer dielectric layer 150 are of the same surface and the top surface of the dummy gates 1110/2110 is partially exposed. The dummy material 110 is used to temporarily fill in for a metal gate (not shown), so it may be considered as a sacrificial material, such as undoped Si. In addition, there may be some dope wells (not shown) in the substrate 101 and the details will not be elaborated here.

There may be an optional barrier/etching-stop layer disposed between the dummy material 110 and the high-k dielectric material layer 103. This optional layer may be made of TiN, SiN . . . etc. This optional layer may increase the compatibility between the dummy material 110 and the high-k dielectric material layer 103, and/or serve as the etching-stop layer when the dummy material 110 is removed in a later step. The dummy gate 1110 may be one of a PMOS or an NMOS and the dummy gate 2110 may be the other.

Figure 12A:
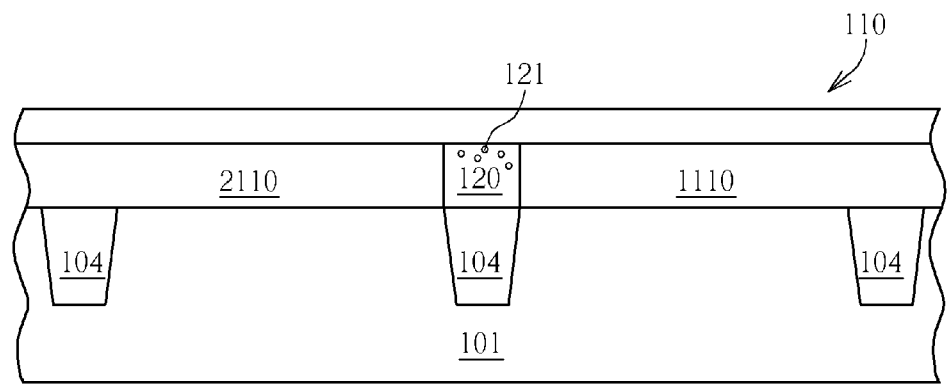

FIG. 12A is a side view taken from the cross section B-B' of FIG. 11. Later, please refer to FIG. 12A, a suitable dopant 121, such as B, Al of a Group (III) element or carbon, is selectively implanted into the dummy material 110 to form a dopant region 120. The locations of the dopant region 120 is preferably pre-determined, so they are located at the border regions, such as on the shallow trench isolation 104, between the adjacent metal gates (not shown) of different types, such as an NMOS and a PMOS. For example, a mask 131 such as a photoresist may be used to protect other regions to introduce the needed dopant 121 into the exposed regions. Later, the mask 131 is removed.

Figure 13:
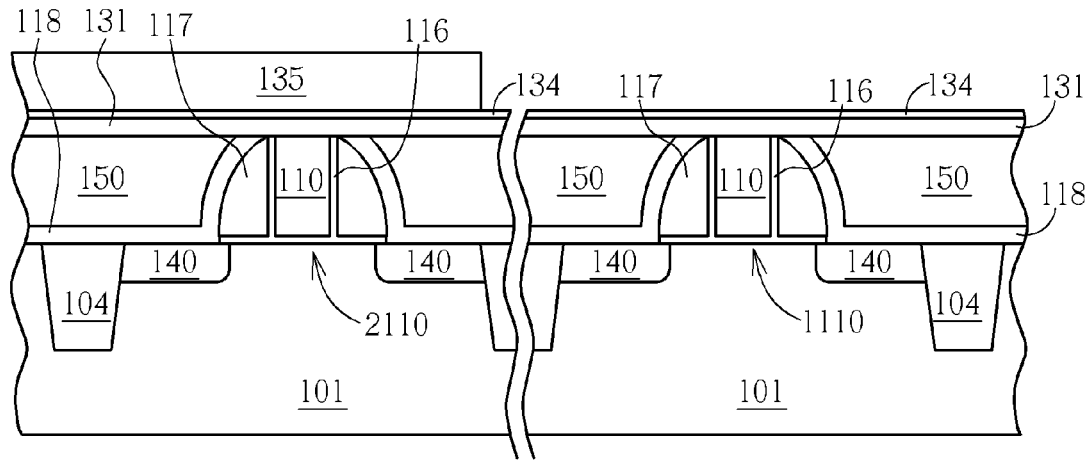

Next, as shown in FIG. 13, a mask 131, such as a TiN hard mask, is blank deposited on the interlayer dielectric layer 150, followed by an oxide layer 134, such as silicon oxide. Then, a patterned photoresist 135 is used to selectively cover one of the dummy gates 1110/2110 (a PMOS or an NMOS). FIG. 13 illustrates that the patterned photoresist 135 covers the dummy gate 2110. Then, the patterned photoresist 135 is used to define the mask 131 as well as the oxide layer 134. For example, an etching step is used to transfer the pattern of the patterned photoresist 135 to the mask 131. Later, the photoresist 135 is stripped off.

Figure 14:
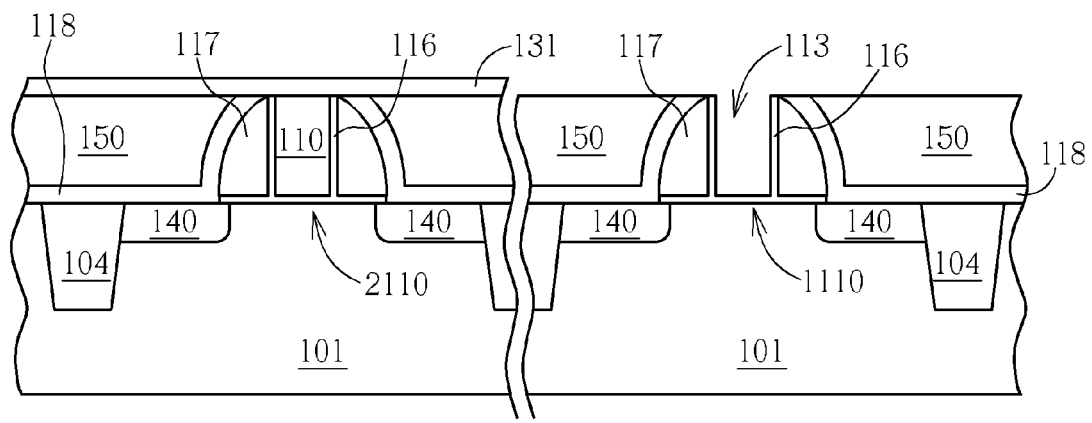

Afterwards, please refer to FIG. 14, the dummy material 110 in one of the dummy gates 1110/2110 is etched under the protection of the mask 131. Owing to the protection of the mask 131, only one of the dummy materials 110 in the exposed dummy gates 1110/2110 is removed. FIG. 14 illustrates only the dummy material 110 in the exposed dummy gate 1110 is removed to form a first recess 113 and the dummy material 110 in the exposed dummy gate 2110 remains.

Figure 14A:
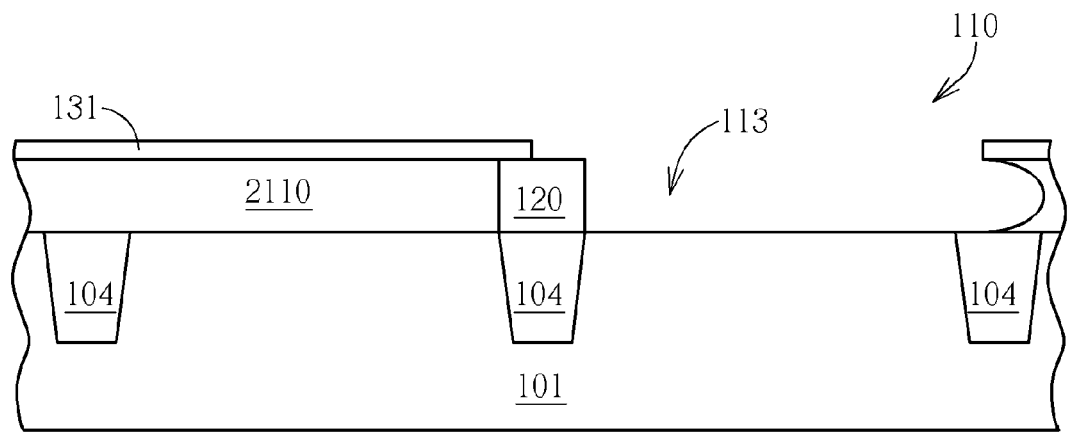

FIG. 14A is a side view taken from the cross section B-B' of FIG. 11. Due to the protection of the mask 131 and the dopant region 120, the dummy gate 2110 which is protected by the etching mask 133 and the dopant region 120 which is subject to a lower etching rate remain substantially intact in this etching step. As a result, the first recess 133 does not and cannot extend into the adjacent dopant region 120. Given the above, there is no possible collateral lateral etching and there is no drawback of the undercut formed below the etching mask 133 since there is no undercut present.

The term "the dopant region 120 which is subject to a lower etching rate remains substantially intact" means the etching selectivity between the first region 111 and the dopant region 120 is at least greater than 50 under such selective etching step. Such etching selectivity is subject to different conditions, such as etchants, temperatures . . . etc.

In one embodiment of the present invention, a wet etching, such as using a basic etchant, is employed to execute the selective removal of the dummy gate 1110. A suitable etchant maybe a diluted HF (DHF) along with aqueous ammonia or tetramethylammonium hydroxide (TMAH). For example, the diluted HF (DHF) is first used to carry out a pre-etching at room temperature. Next, the basic etchant completely removes the dummy gate 1110 to form a first recess 113. Or alternatively, a dry etching may go with a wet etching. For example, a wet etching is used after a dry etching to execute the formation of the first recess 113 in the dummy gate 1110.

Figure 15:
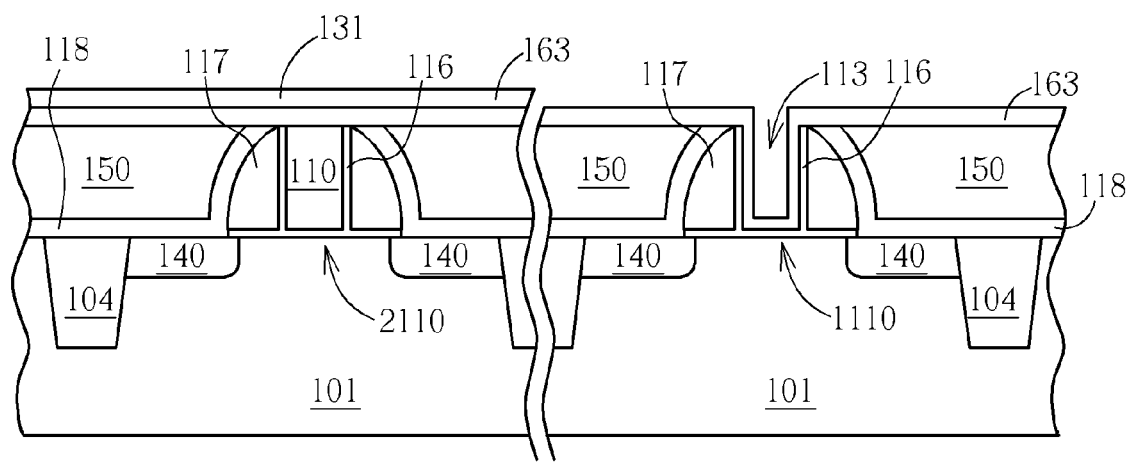
Figure 15A:
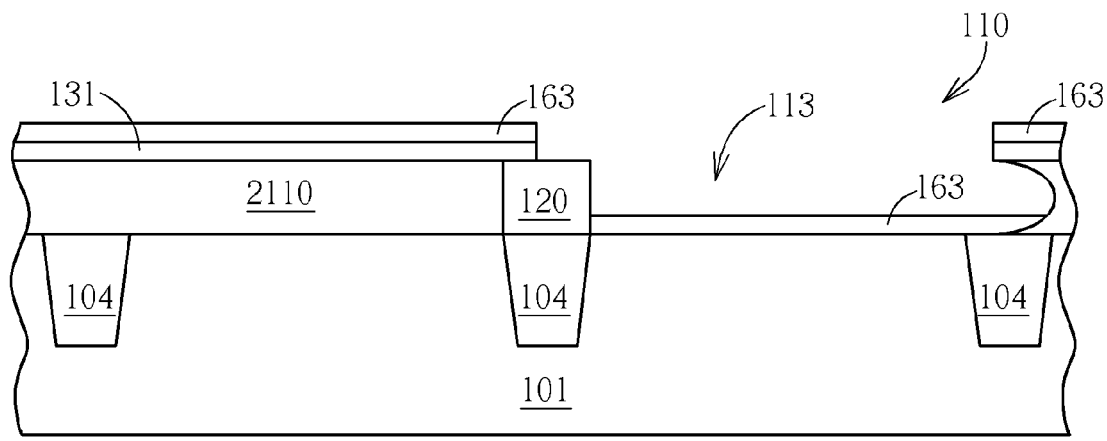

Then please refer to FIG. 15, after the dummy material 110 in some exposed dummy gate is removed, the required first work function metal layer 163 is used to fill the first recess 113 under the protection of the mask 131. FIG. 15A is a side view taken from the cross section B-B' of FIG. 11. If a blank deposition is used, the first work function metal layer 163 covers the mask 131. Optionally, a PMOS or an NMOS is constructed, so a correspondingly suitable first work function metal layer 163 is used. Accordingly, the suitable first work function metal layer 163 maybe a PMOS work function metal layer or an NMOS work function metal layer. The N-type work function metal material may be TiN, TaC, TaN, TaSiN$_y$, and/or Al. The P-type work function metal material may be TiN, W, WN, Pt, Ni, Ru, TaCN or TaCNO.

Figure 16:
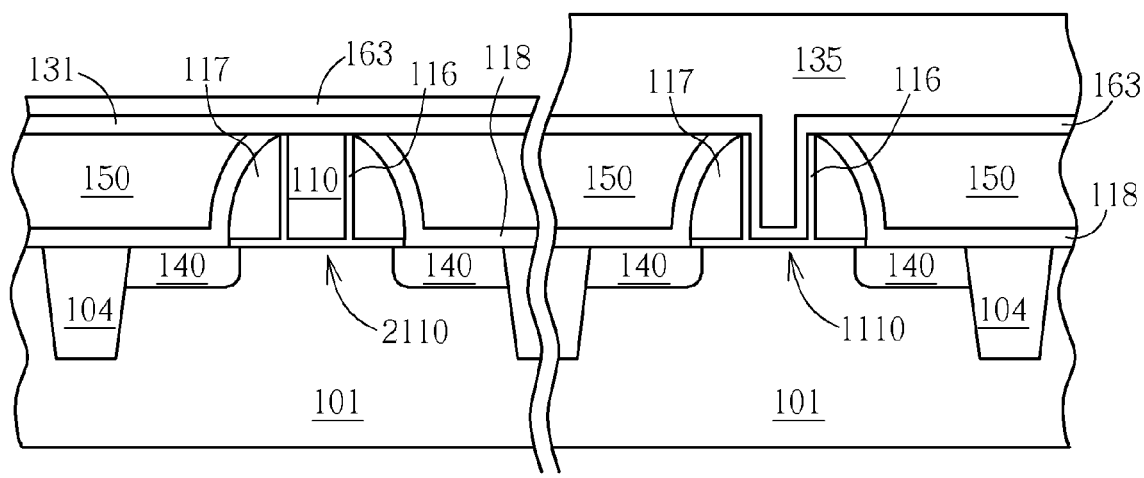
Figure 16A:
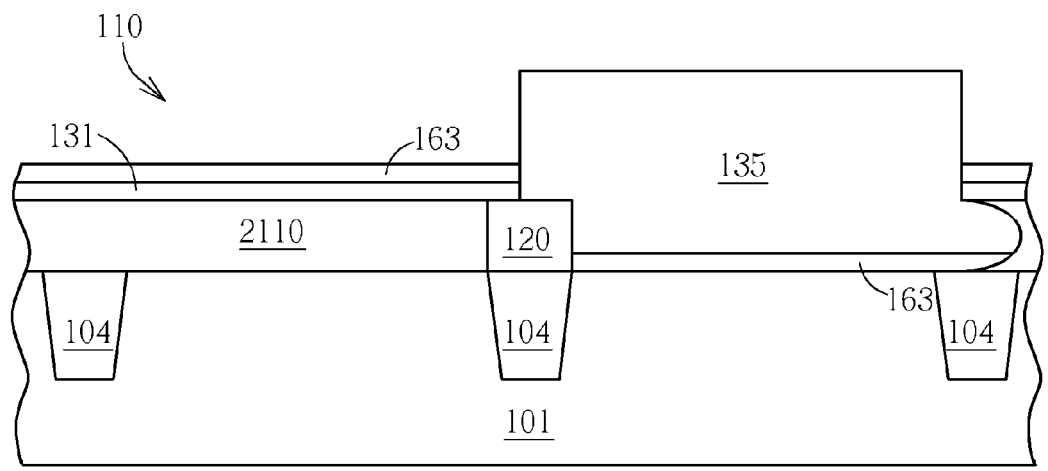

Please refer to FIG. 16, another patterned photoresist 135 is used to cover what is not covered by the mask 131 so the patterned photoresist 135 covers the first recess 113 and some of the first work function metal layer 163. FIG. 16A is a side view taken from the cross section B-B' of FIG. 11. Optionally, there may be a BARC layer in the patterned photoresist 135.

Afterwards, the patterned photoresist 135 serves as a mask to remove the exposed first work function metal layer 163 as well as the mask 131 . Consequently, the other dummy gate (the dummy gate 2110 is illustrated) and the dummy material 110 within are exposed. After that, the patterned photoresist 135 is removed.

Figure 17:
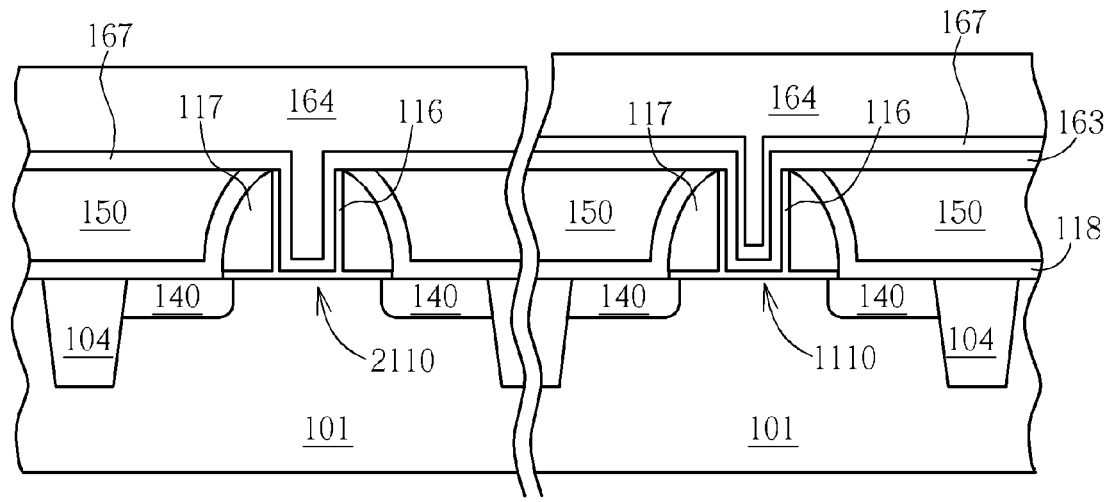

Subsequently, please refer to FIG. 17, the exposed dummy material 110 and the dopant region 120 are removed to form a second recess 115. Next, another required second work function metal layer 167 is used to fill the second recess 115 as well as the first recess 113 collaterally. Later, a low resistance metal 164 simultaneously replaces the previous dummy gates 1110/2110, namely the first recess 113 and the second recess 115, to form the first metal gate 160 and the second metal gate 165.

Then, a process such as CMP may be used to remove any excess first work function metal layer 163, the second work function metal layer 167 and the low resistance metal 164, the first metal gate 160 and the second metal gate 165 are done. If the first metal gate 160 is one of a PMOS and an NMOS, the second metal gate 165 is the other one. Correspondingly, the sources and drains 140 adjacent to the first metal gate 160 or the second metal gate 165 have the corresponding P or N conductivity. The first metal gate 160 and the second metal gate 165 are gates next to each other in an SRAM The suitable high-k dielectric layer 103 and the work function metal layer 163/167 are known to persons in the art. For example, the high-k dielectric layer 103 may be HfSiO$_x$, HfSiO$_x$N$_y$, HfO$_x$, LaO$_x$, LaAlO$_x$, ZrO$_x$, ZrSiO$_x$, HfZrO$_x$ or the combination thereof. The N-type work function metal material may be TiN, TaC, TaN, TaSiN$_y$ and/or Al. The P-type work function metal material may be TiN, W, WN, Pt, Ni, Ru, TaCN or TaCNO.

After the first metal gate 160 and the second metal gate 165 are done, the formation of the contact plugs 170 for use in electrically connecting the source/drain 140 of the first metal gate 160 and the second metal gate 165 follows. For example, please refer to FIG. 10 for details.

Those skilled in the art will readily observe that numerous modifications and alterations of the device and method may be made while retaining the teachings of the invention.

What is claimed is:

1. A method for forming a metal gate, comprising:
    providing a substrate;
    depositing a dummy material to completely cover said substrate;
    selectively implanting a dopant into said dummy material to form a doped region;
    removing part of said dummy material to expose part of said substrate and to form a dummy gate comprising said dopant region, a first region and a second region, wherein said dopant region is disposed between said first region and said second region;
    forming an interlayer dielectric layer on said exposed substrate to surround said dummy gate;
    performing a selective etching step to remove said first region in said dummy gate to form a first recess without substantially removing said dopant region and said second region so that said first recess does not extend into said dopant region; and
    filling said recess with a first material set to form a first metal gate.

2. The method of claim 1, wherein said dummy material comprises Si.

3. The method of claim 1, wherein said dopant is selected form a group consisting of a Group (III) element and carbon.

4. The method of claim 1, further comprising a first mask for defining said dopant region.

5. The method of claim 1, further comprising a second mask for covering said dummy material to facilitate the formation of said dummy gate when part of said dummy material is removed.

6. The method of claim 5, after said removal step further comprising:
    performing a source/drain doping step to form a source/drain in said exposed substrate adjacent to said dummy gate, wherein said second mask cover said dummy gate in said source/drain doping step.

7. The method of claim 1, further comprising a wet etching step to remove said dummy material.

8. The method of claim 7, wherein a basic etchant is used in said wet etching step.

9. The method of claim 1, wherein said first recess is substantially free of an undercut.

10. The method of claim 1, wherein said first material set comprises a low resistance metal and a first work function material.

11. The method of claim 1, further comprising:
    removing said dopant region and said second region in said dummy gate to form a second recess; and
    filling said recess with a second material set to form a second metal gate.

12. The method of claim 1, wherein said dopant region and said second region are removed at the same time.

13. The method of claim 1, wherein said dopant region and said second region are sequentially removed.

14. The method of claim 1, further comprising:
    thickening said interlayer dielectric layer to cover said first metal gate and said second metal gate; and
    forming a contact plug to penetrate said interlayer dielectric layer to electrically connect to said substrate.

15. The method of claim 11, wherein said second material set comprises a low resistance metal and a second work function material.

16. The method of claim 11, wherein said first metal gate is one of a PMOS and an NMOS and said second metal gate is the other.

17. The method of claim 16, wherein both said first metal gate and said second metal gate are in an SRAM.

18. The method of claim 5, wherein said second mask comprises a metal material.

19. The method of claim 1, further comprising an etching mask for protecting said second region when performing said selective etching step.

20. The method of claim 19, wherein a photoresist is used to pattern a hard mask material to form said etching mask, which comprises a nitride and an oxide.

21. The method of claim 11, wherein a low resistance metal is used to simultaneously fill said first recess and said second recess to form said first metal gate and said second metal gate.

* * * * *